(12) United States Patent
Bonam et al.

(10) Patent No.: US 11,081,424 B2
(45) Date of Patent: Aug. 3, 2021

(54) MICRO-FLUIDIC CHANNELS HAVING VARIOUS CRITICAL DIMENSIONS

(71) Applicant: International Business Machines Corporation, Armonk, NY (US)

(72) Inventors: Ravi K. Bonam, Albany, NY (US); Kamal K. Sikka, Poughkeepsie, NY (US); Joshua M. Rubin, Albany, NY (US); Iqbal Rashid Saraf, Cobleskill, NY (US); Fee Li Lie, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/444,383

(22) Filed: Jun. 18, 2019

(65) Prior Publication Data
US 2020/0402889 A1   Dec. 24, 2020

(51) Int. Cl.
*H01L 23/473* (2006.01)
*H01L 21/768* (2006.01)
*F28F 3/12* (2006.01)

(52) U.S. Cl.
CPC .............. *H01L 23/473* (2013.01); *F28F 3/12* (2013.01); *H01L 21/76816* (2013.01); *F28F 2260/02* (2013.01)

(58) Field of Classification Search
CPC ..... H01L 21/4871–4882; H01L 23/473–4735; H01L 21/76816; F28F 3/12; F28F 2260/02
USPC ....................................................... 257/499
See application file for complete search history.

(56) References Cited

U.S. PATENT DOCUMENTS

| 4,450,472 A | 5/1984 | Tuckerman et al. |
| 4,567,505 A | 1/1986 | Pease et al. |
| 4,894,709 A | 1/1990 | Phillips et al. |
| 5,057,908 A | 10/1991 | Weber |

(Continued)

OTHER PUBLICATIONS

Che et al., "Design Optimization and Characterization of Silicon Microcooler System Through Finite-Element Modeling and Experimental Analyses." IEEE Transactions on Components, Packaging and Manufacturing Technology 6, No. 2 pp. 224-237 (2016).

(Continued)

*Primary Examiner* — Mohammad M Hoque
(74) *Attorney, Agent, or Firm* — Cantor Colburn LLP; Abdy Raissinia

(57) ABSTRACT

Embodiments of the present invention are directed to microchannels having varied critical dimensions for efficient cooling of semiconductor integrated circuit chip packages. In a non-limiting embodiment of the invention, a patterning stack is formed over a substrate. The patterning stack includes a hard mask, an etch transfer layer on the hard mask, and a photoresist on the etch transfer layer. A manifold trench is formed in a first region of the substrate and is recessed below a surface of the etch transfer layer. A microchannel trench is formed in a second region of the substrate to expose the surface of the etch transfer layer. The manifold trench and the microchannel trench are recessed such that the manifold trench extends into the hard mask and the microchannel trench extends into the etch transfer layer. A manifold and a microchannel are formed in the substrate by pattern transfer.

17 Claims, 12 Drawing Sheets

(56) References Cited

U.S. PATENT DOCUMENTS

| | | | |
|---|---|---|---|
| 5,099,311 | A | 3/1992 | Bonde et al. |
| 5,099,910 | A | 3/1992 | Walpole et al. |
| 5,801,442 | A | 9/1998 | Hamilton et al. |
| 5,830,624 | A | 11/1998 | Bae et al. |
| 6,517,234 | B1 | 2/2003 | Kopf-Sill et al. |
| 6,582,987 | B2 | 6/2003 | Jun et al. |
| 6,934,154 | B2 | 8/2005 | Prasher et al. |
| 6,992,382 | B2 | 1/2006 | Chrysler et al. |
| 7,139,172 | B2 | 11/2006 | Bezama et al. |
| 7,190,580 | B2 | 3/2007 | Bezama et al. |
| 7,432,592 | B2 | 10/2008 | Shi et al. |
| 2002/0017660 | A1* | 2/2002 | Villa ............... B01L 3/502707 257/216 |
| 2002/0081866 | A1* | 6/2002 | Choi ............... F04B 53/1077 438/800 |
| 2005/0139996 | A1* | 6/2005 | Myers ............... H01L 23/473 257/712 |
| 2005/0277280 | A1* | 12/2005 | Brunschwiler ..... H01L 23/3677 438/616 |
| 2008/0134753 | A1* | 6/2008 | Jun ............... G01N 27/128 73/23.2 |
| 2015/0252414 | A1* | 9/2015 | Bai ............... C12Q 1/6869 216/2 |
| 2015/0348868 | A1* | 12/2015 | Lin ............... H01L 21/4817 257/714 |
| 2018/0254191 | A1* | 9/2018 | Ohtake ............ H01J 37/32449 |
| 2018/0354267 | A1* | 12/2018 | Fukumoto ......... B41J 2/1642 |

OTHER PUBLICATIONS

Colgan et al., "A practical implementation of silicon microchannel coolers for high power chips", IEEE Transactions on Components and Packaging Technologies 30, No. 2, pp. 218-225 (2007).

Dowling et al., "Inductive coupled plasma etching of high aspect ratio silicon carbide microchannels for localized cooling." in ASME 2015 International Technical Conference and Exhibition on Packaging and Integration of Electronic and Photonic Microsystems collocated with the ASME 2015 13th International Conference on Nanochannels, Microchannels, and Minichannels, pp. V003T07A006-1 to 6, American Society of Mechanical Engineers, 2015.

\* cited by examiner

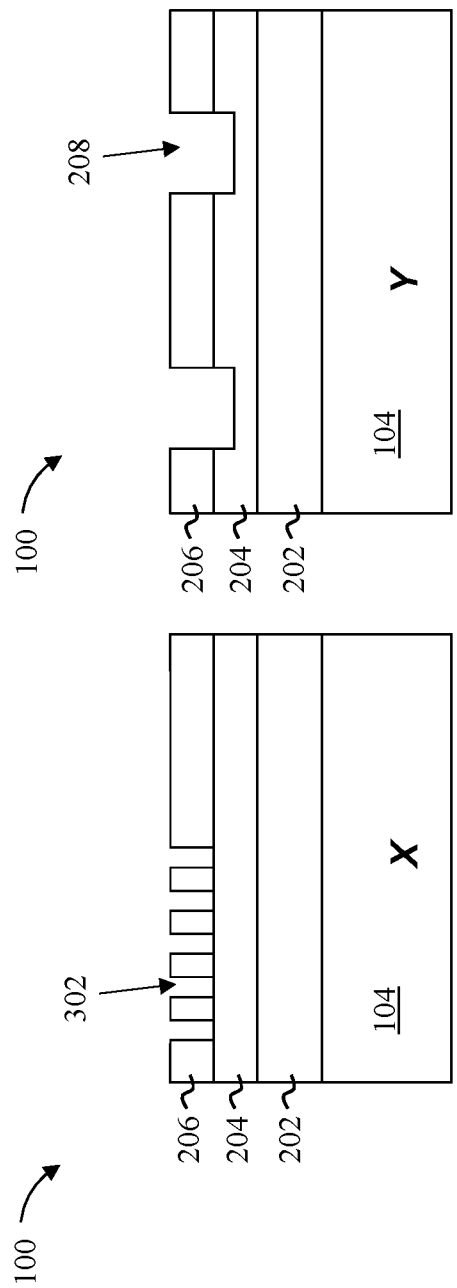

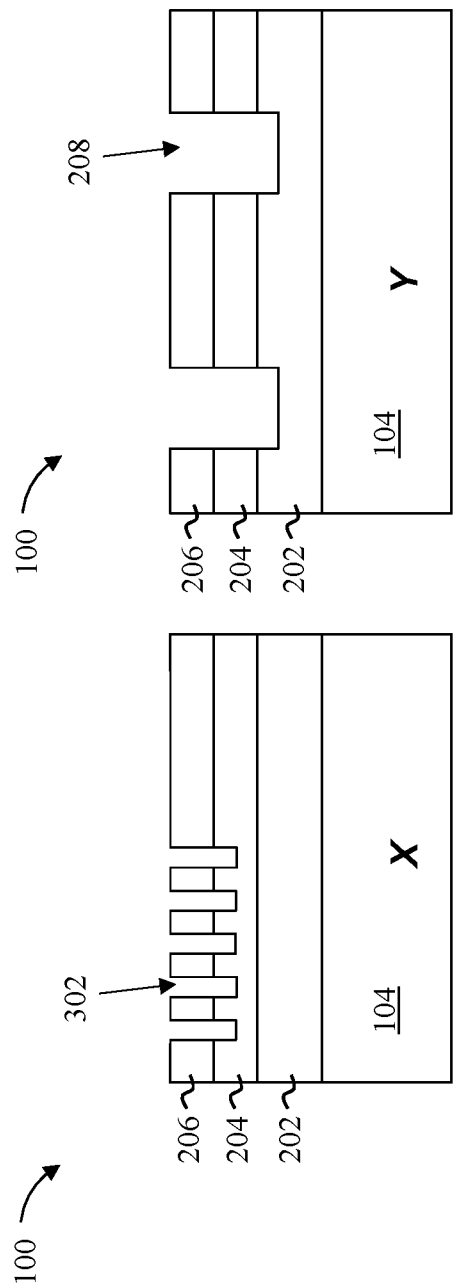

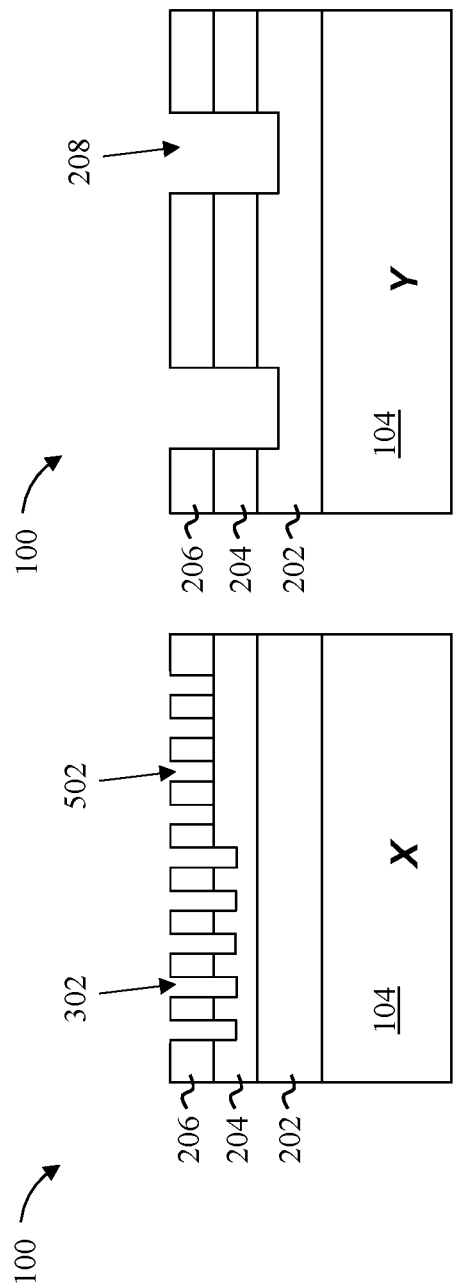

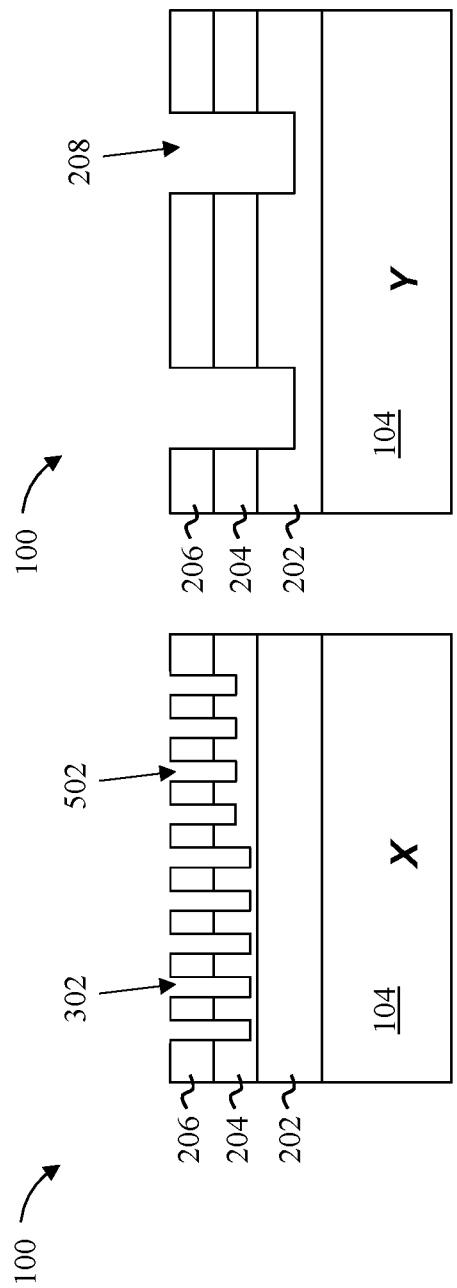

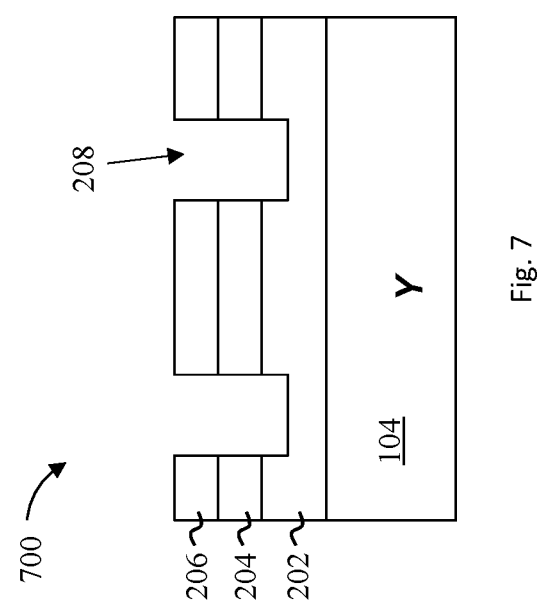

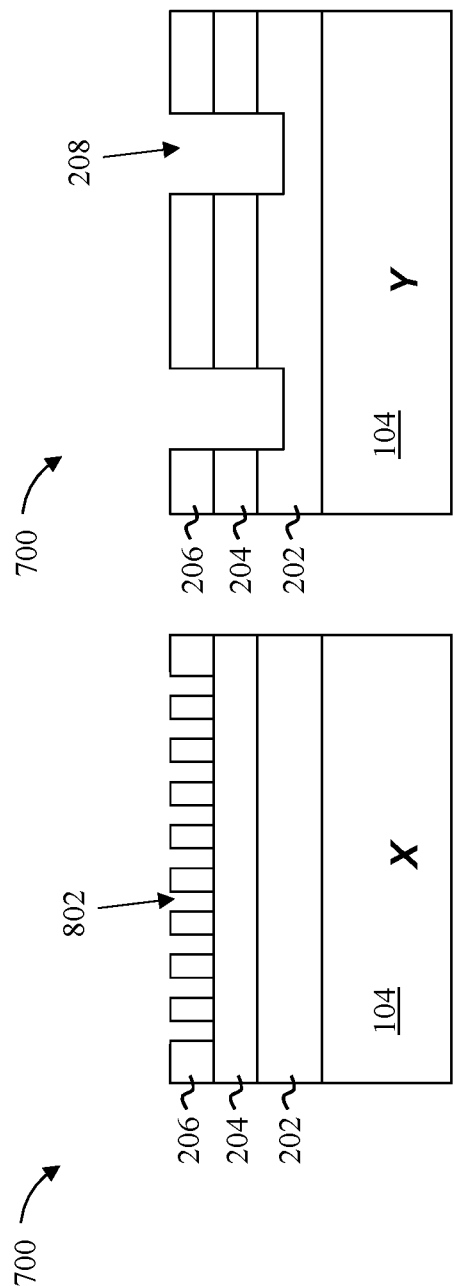

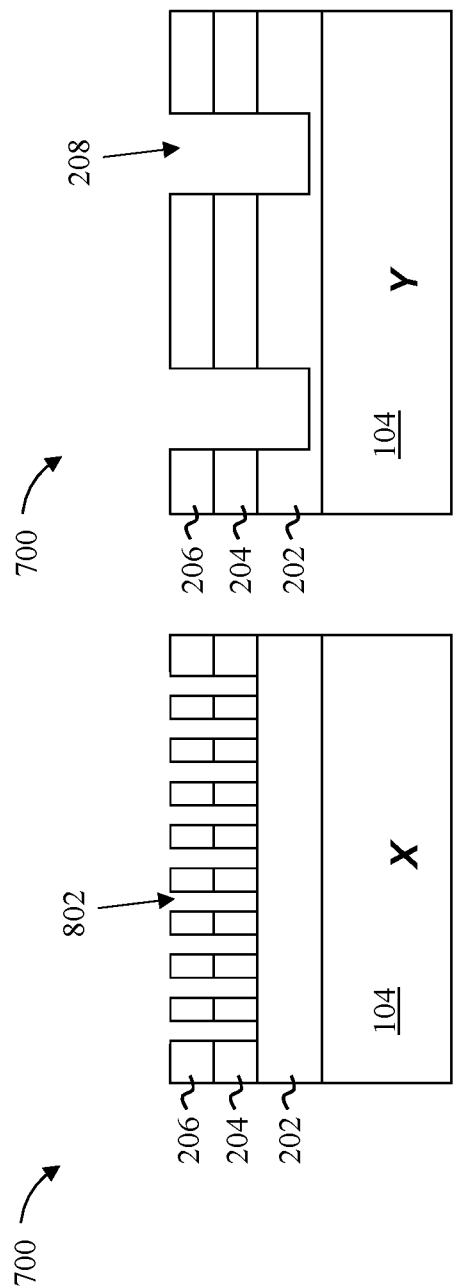

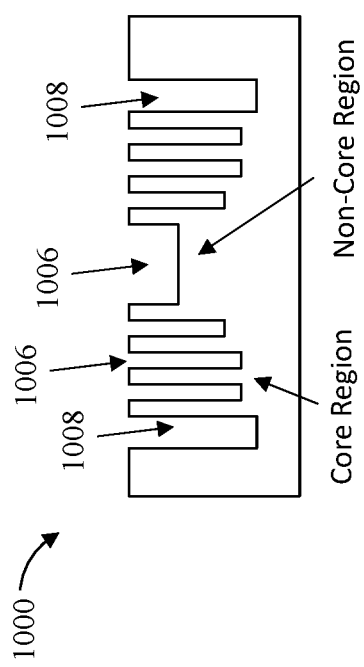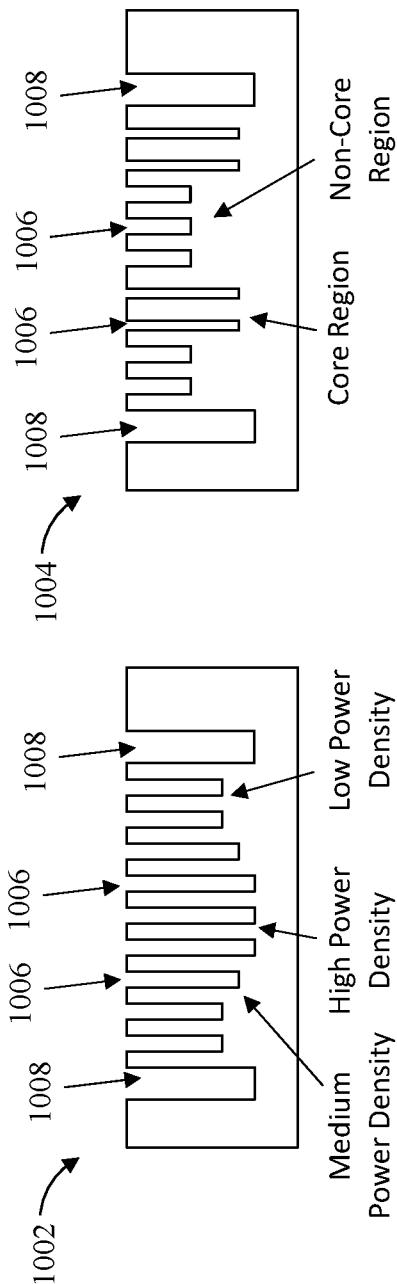

US 11,081,424 B2

MICRO-FLUIDIC CHANNELS HAVING VARIOUS CRITICAL DIMENSIONS

BACKGROUND

The present invention relates generally to devices and methods for cooling electronic devices. More specifically, the present invention relates to micro-fluidic channel (microchannel) cooling apparatus and methods that provide channels having varied critical dimensions for efficient cooling of semiconductor integrated circuit (IC) chip packages.

In the design and manufacture of semiconductor IC chip packages and modules it is imperative to implement mechanisms that can effectively remove heat generated by IC chip devices (such as microprocessors) to ensure the continued reliable operation of such devices. Heat removal is particularly important for computer processor chips that are disposed in SCM (single chip modules) or MCMs (multichip modules), for example, which can generate significant amounts of heat.

There are various heat removal techniques that have been developed for cooling semiconductor IC packages/modules and other electronic devices. For example, microchannel cooling apparatus and methods have been proposed for cooling electronic devices such as IC chips, MCMs, diode laser arrays, and other electro-optic devices under conditions of increased heat flux (power/unit area) or high-power densities (e.g., 700 W/cm$^2$ or more).

SUMMARY

Embodiments of the invention are directed to a method for providing microchannels having varied critical dimensions for efficient cooling of semiconductor integrated circuit chip packages. A non-limiting example of the method includes forming a patterning stack over a substrate. The patterning stack includes a hard mask, an etch transfer layer on the hard mask, and a photoresist on the etch transfer layer. A manifold trench is formed in a first region of the substrate and is recessed below a surface of the etch transfer layer. A microchannel trench is formed in a second region of the substrate to expose the surface of the etch transfer layer. The manifold trench and the microchannel trench are recessed such that the manifold trench extends into the hard mask and the microchannel trench extends into the etch transfer layer. A manifold and a microchannel are formed in the substrate by pattern transfer of the manifold trench and the microchannel trench.

Embodiments of the invention are directed to a method for providing microchannels having varied critical dimensions for efficient cooling of semiconductor integrated circuit chip packages. A non-limiting example of the method includes forming a patterning stack over a substrate. The patterning stack includes a hard mask, an etch transfer layer on the hard mask, and a photoresist on the etch transfer layer. A manifold trench is formed in a first region of the substrate and is recessed below a surface of the hard mask. A microchannel trench is formed in a second region of the substrate to expose the surface of the etch transfer layer. The manifold trench and the microchannel trench are recessed such that the manifold trench extends into the hard mask and the microchannel trench exposes a surface of the hard mask. A manifold and a microchannel are formed in the substrate by pattern transfer of the manifold trench and the microchannel trench.

Embodiments of the invention are directed to a semiconductor structure. A non-limiting example of the semiconductor device includes a substrate having a first region, a second region, an input manifold, and an output manifold. The device includes one or more first microchannels formed in the first region of the substrate. A first end of the first microchannels is coupled to the input manifold and a second end of the first microchannels is coupled to the output manifold. The device includes one or more second microchannels formed in the second region of the substrate. A first end of the second microchannels is coupled to the input manifold and a second end of the second microchannels is coupled to the output manifold. A critical dimension of the first microchannels is different than a critical dimension of the second microchannels.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3A depicts a cross-sectional view of a semiconductor structure after a processing operation according to one or more embodiments of the invention;

FIG. 3B depicts a cross-sectional view of a semiconductor structure after a processing operation according to one or more embodiments of the invention;

FIG. 4A depicts a cross-sectional view of a semiconductor structure after a processing operation according to one or more embodiments of the invention;

FIG. 4B depicts a cross-sectional view of a semiconductor structure after a processing operation according to one or more embodiments of the invention;

FIG. 5A depicts a cross-sectional view of a semiconductor structure after a processing operation according to one or more embodiments of the invention;

FIG. 5B depicts a cross-sectional view of a semiconductor structure after a processing operation according to one or more embodiments of the invention;

FIG. 6A depicts a cross-sectional view of a semiconductor structure after a processing operation according to one or more embodiments of the invention;

FIG. 6B depicts a cross-sectional view of a semiconductor structure after a processing operation according to one or more embodiments of the invention;

FIG. 7 depicts a cross-sectional view of a semiconductor structure after a processing operation according to one or more embodiments of the invention;

FIG. 8A depicts a cross-sectional view of a semiconductor structure after a processing operation according to one or more embodiments of the invention;

FIG. 8B depicts a cross-sectional view of a semiconductor structure after a processing operation according to one or more embodiments of the invention;

FIG. 9A depicts a cross-sectional view of a semiconductor structure after a processing operation according to one or more embodiments of the invention;

FIG. 9B depicts a cross-sectional view of a semiconductor structure after a processing operation according to one or more embodiments of the invention;

FIG. 10A depicts a cross-sectional view of a semiconductor structure after a processing operation according to one or more embodiments of the invention;

FIG. 10B depicts a cross-sectional view of a semiconductor structure after a processing operation according to one or more embodiments of the invention;

FIG. 10C depicts a cross-sectional view of a semiconductor structure after a processing operation according to one or more embodiments of the invention;

Figure 1:
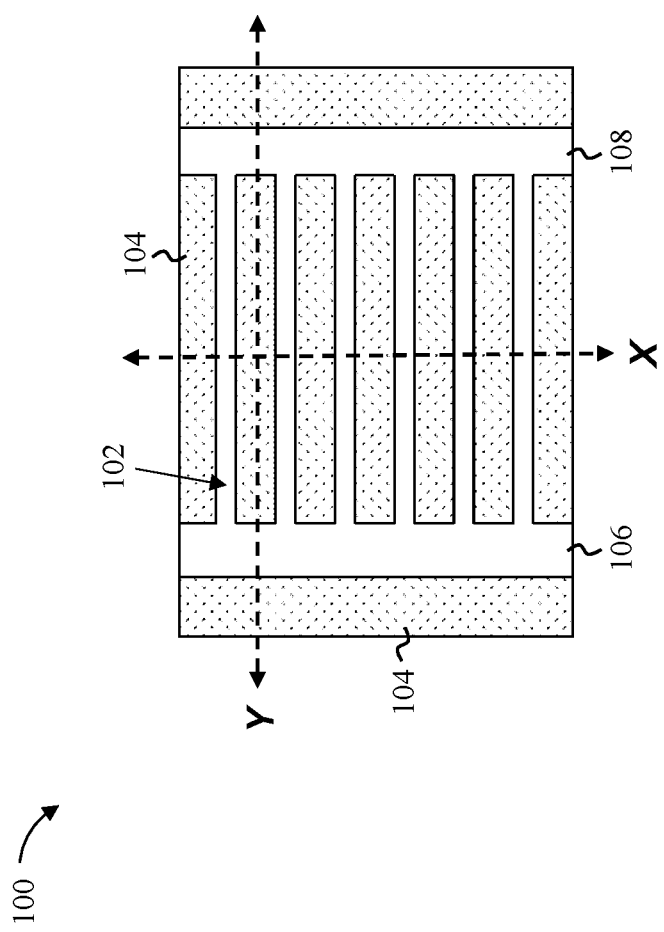
FIG. 1 depicts a cross-sectional view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, the ability to efficiently remove heat from an integrated circuit or component has become increasing problematic as chip geometries continue to scale down and operating speeds increase, due in part to the resulting increase in power densities. Although IC chip modules are being continually designed to operate at higher clock frequencies, increased system performance is becoming increasingly limited primarily by the ability to effectively remove heat from such IC chip modules.

Complicating matters further, sophisticated microprocessor architectures experience a high level of heat variation across the device surface. In other words, temperature spikes are concentrated in cores having the highest power density, while non-core regions typically experience lower temperatures. While conventional micro-fluidic channels (microchannels) offer improved cooling capabilities sufficient to handle high power densities, the cooling profiles are uniform. This results in an inefficient cooling system that is prone to overdesign in the non-core regions (which are required to ensure that cooling is sufficient in high power density regions), requires a larger pump, and robs core regions of cooling.

Turning now to an overview of aspects of the present invention, one or more embodiments of the invention address the above-described shortcomings of the prior art by providing a new microchannel structure and a method for providing microchannels having varied critical dimensions for efficient cooling of semiconductor integrated circuit chip packages. Unlike known microchannels, microchannel structures in accordance with embodiments of the invention concentrate cooling in core regions by providing narrower, deeper channels over the cores and wider, shallower channels over the non-core regions. The relatively wider and shallower non-core channels also limit the unnecessary increase in pressure drop that afflicts conventional microchannels, reducing cooling pump requirements. The method leverages material etch differentials to create microchannels having various depths and widths (referred together as critical dimensions). The depths and widths are spatially adjusted within a silicon or semiconductor micro-cooler structure based on the thermal loads involved in a given integrated circuit design. The various depths/widths of the microchannels enable differential coolant flows for a tailored thermal performance. The fluid flow through the microchannels can either be in a liquid phase, a gas phase, or a combination of both. Advantageously, distributing the microchannels in this manner can also aid in the compensation of any warpage caused due to a thermal expansion mismatch.

Turning now to a more detailed description of aspects of the present invention, FIG. 1 depicts a top-down cross-sectional view of a semiconductor structure 100 after an initial set of fabrication operations have been applied as part of a method of fabricating a final semiconductor device according to one or more embodiments of the invention. In embodiments of the invention, the final semiconductor device can include one or more microchannels 102 formed over a substrate 104. The microchannels 102 can be connected to an input manifold 106 and an output manifold 108.

The substrate 104 can be made of any suitable material, such as, for example, silicon or silicon germanium. In some embodiments of the invention, the substrate 104 is a silicon substrate. In some embodiments of the invention, the substrate 104 is a wafer. In some embodiments of the invention, the substrate 104 is a part of a wafer or a chip.

As shown in FIG. 1, the microchannels 102 can be openings formed in the substrate 104. As discussed in further detail herein, the microchannels 102 can be formed to any suitable width(s). For example, the microchannels 102 can be formed to a width of 1 to 10 microns, for example 5 microns, although other microchannel widths are within the contemplated scope of the invention. In some embodiments of the invention, each of the microchannels 102 can be formed to a same width, while in other embodiments the microchannels 102 can be formed to different widths. The microchannels 102 can be formed to any suitable depth, for example a depth ranging from 0.1 to 100 microns. In some embodiments of the invention, each of the microchannels 102 can be formed to a same depth, while in other embodiments the microchannels 102 can be formed to different depths. Further, in some embodiments of the invention, the microchannels 102 can be formed to a same depth but have varying widths. Conversely, the microchannels 102 can be formed to a same width but have varying depths. In this manner, the microchannels 102 can be formed to various depths/widths to accommodate any heat profile generated by any number of devices in or on the substrate 104.

While the microchannels 102 depicted in FIG. 1 are shown to be substantially uniform and parallel for ease of illustration, it is understood that the microchannels 102 can be formed to any desired orientation or profile. For example, in some embodiments of the invention, the microchannels 102 have a generally round or oval profile. In some embodiments of the invention, the microchannels 102 define a pattern of cooling channels that substantially extends or runs throughout substrate 104 or a portion of the substrate 104. For example, if the substrate 104 is a wafer having one or more high-power density areas (e.g., chip cores), the microchannels 102 can form a pattern of cooling channels that substantially extends throughout the substrate 104. In some embodiments of the invention, the microchannels 102 are vertically stacked over the high-power density areas (e.g., chip cores).

In some embodiments of the invention, the microchannels 102 form discrete cooling regions that each correspond to a die (or core) of a wafer. The microchannels 102 can be coupled (for example, on opposite ends) to the input manifold 106 and the output manifold 108. In this manner, a cooling medium (cooling fluid) can pass from the input manifold, through the microchannels 102, and out the output manifold 108. The cooling medium can be forced across the microchannels 102 using, for example, a cooling pump (not depicted).

Figure 2:
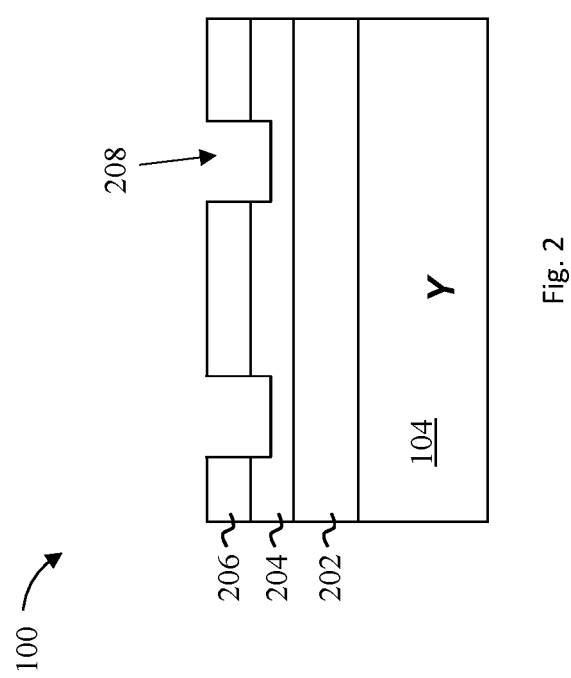
FIG. 2 depicts a cross-sectional view of a semiconductor structure after a processing operation according to one or more embodiments of the invention.

FIGS. 2-6B depict a process for forming microchannels having varied critical dimensions that relies on creating an etch differential in an oxide layer of a patterning stack. FIG. 2 depicts a cross-sectional view of the semiconductor structure 100 taken along the line Y of FIG. 1 after a processing operation according to one or more embodiments of the invention. In some embodiments of the invention, a patterning film stack is formed over the substrate 104. The patterning film stack can be a bi-layer stack, a tri-layer stack, or a multilayer stack having a topmost photoresist layer.

As illustrated in FIG. 2, the patterning film stack includes a hard mask 202, an etch transfer layer 204 (sometimes referred to as an image transfer layer), and a photoresist 206. In some embodiments of the invention, hard mask 202 is a bottommost layer of the patterning film stack formed on a surface of the substrate 104. The hard mask 202 can be formed over the surface of the substrate 104 using any suitable process. In some embodiments of the invention, the hard mask 202 can be formed using, for example, CVD, PECVD, ALD, flowable CVD, spin-on dielectrics, or PVD. In some embodiments of the invention, the hard mask 202 is made of a material selected to provide an etch characteristic (e.g., an etch selectivity) with respect to the etch transfer layer 204. For example, the hard mask 202 can be made of a material that can be selectively etched at a faster etch rate than the etch transfer layer 204. In some embodiments of the invention, the hard mask 202 can be made of, for example, a nitride, silicon nitride, SiC, or SiBCN. In some embodiments of the invention, the hard mask 202 is formed to a thickness of 1 to 15 microns, for example 10 microns, although other thicknesses are within the contemplated scope of the invention.

In some embodiments of the invention, the hard mask 202 includes an organic planarization layer (OPL). Patterning film stacks typically include OPLs because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

In some embodiments of the invention, the OPL can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL can include any organic polymer and a photo-active compound having a molecular structure that can attach to the molecular structure of the organic polymer. In some embodiments of the invention, the OPL material is selected to be compatible with an overlying antireflective coating, the overlying photoresist, and the lithographic wavelength employed (i.e., ArF, KrF, etc.). In some embodiments of the invention, the OPL can be applied using, for example, spin coating technology.

As further illustrated in FIG. 2, the etch transfer layer 204 can be formed over a surface of the hard mask 202. In some embodiments of the invention, the etch transfer layer 204 can be formed using a material selected to ensure an etch selectivity (e.g., a slower etch rate) with respect to the hard mask 202. For example, if the hard mask 202 is silicon nitride, the etch transfer layer 204 can include an oxide, such as, silicon dioxide, a low temperature oxide (LTO), silicon oxynitride (SiON), thermal silicon dioxide, plasma-enhance chemical vapor deposited (PECVD) silicon dioxide, and tetraethyl orthosilicate ($Si(OC_2H_5)_4$) (TEOS) silicon dioxide, so long as the oxide will etch at a slower rate than the hard mask 202 (e.g., silicon nitride) when exposed to an etchant, for example, a $CF_4$ plasma etch. In some embodiments of the invention, the etch transfer layer 204 is formed to a thickness of 2 to 10 microns, for example 8 microns, although other thicknesses are within the contemplated scope of the invention. The etch transfer layer 204 can be deposited using, for example, a spin-on process. In some embodiments of the invention, the etch transfer layer 204 is deposited to a thickness of about 0.5 to about 5 nm, although other thicknesses are within the contemplated scope of the invention.

As further illustrated in FIG. 2, the photoresist 206 can be formed over a surface of the etch transfer layer 204. In some embodiments of the invention, the photoresist 206 can include an antireflective coating (not shown). The photoresist 206 can include any suitable photoresist material, such as, for example, 248 nm resists, 193 nm resists, 157 nm resists, or EUV (extreme ultraviolet) resists. In some embodiments of the invention, the photoresist 206 can be made of a light sensitive polymer, and can be deposited using any suitable resist process, such as spin-on coating.

As illustrated in FIG. 2, in some embodiments of the invention, portions of the photoresist 206 can be patterned in a first region of the substrate 104 to expose a top surface of the etch transfer layer 204. The photoresist 206 can be patterned using a wet etch, a dry etch, or a combination of wet and/or dry etches, or any suitable photolithographic technique. In some embodiments of the invention, the photoresist 206 is patterned selective to the etch transfer layer 204. In this manner, manifold(s) 208 (i.e., an input manifold and an output manifold) can be formed over the substrate 104.

In some embodiments of the invention, the exposed surface of the etch transfer layer 204 in the manifolds 208 can be recessed. The etch transfer layer 204 can be recessed using a wet etch, a dry etch, or a combination of wet and/or dry etches. In some embodiments of the invention, the etch transfer layer 204 is recessed using a RIE. In some embodiments of the invention, the RIE is selective to the photoresist 206. In this manner, the manifolds 208 are already partially etched into the etch transfer layer 204 prior to forming any microchannels.

FIGS. 3A and 3B depict cross-sectional views of the semiconductor structure 100 taken along the lines X and Y of FIG. 1, respectively, after a processing operation according to one or more embodiments of the invention. As shown in FIG. 3A, in some embodiments of the invention, portions of the photoresist 206 in a second region of the substrate 104 can be patterned to expose a surface of the etch transfer layer 204. In this manner, one or more microchannels 302 (sometimes referred to as cooling trenches) can be formed over the substrate 104. In some embodiments of the invention, the photoresist 206 is patterned selective to the etch transfer layer 204.

FIGS. 4A and 4B depict cross-sectional views of the semiconductor structure 100 taken along the lines X and Y of FIG. 1, respectively, after a processing operation according to one or more embodiments of the invention. As shown in FIGS. 4A and 4B, in some embodiments of the invention, exposed surfaces of the etch transfer layer 204 and the hard mask 202 can be recessed. The etch transfer layer 204 and the hard mask 202 can be recessed using a wet etch, a dry etch, or a combination of wet and/or dry etches. In some embodiments of the invention, the etch transfer layer 204 and the hard mask 202 are recessed using a RIE. In some embodiments of the invention, the RIE is selective to the photoresist 206.

As further shown in FIGS. 4A and 4B, during this etch process the microchannels 302 can be partially recessed into the etch transfer layer 204, while the manifolds 208 can be recessed through the etch transfer layer 204 and into the hard mask 202. As a result, the microchannels 302 and manifolds 208 have an etch differential with respect to the etch transfer layer 204. This etch differential is a result of the extra manifold etch process discussed previously herein with respect to FIG. 3B.

FIGS. 5A and 5B depict cross-sectional views of the semiconductor structure 100 taken along the lines X and Y of FIG. 1, respectively, after a processing operation according to one or more embodiments of the invention. As shown in FIG. 5A, in some embodiments of the invention, portions of the photoresist 206 in a third region of the substrate 104 can be patterned to expose a surface of the etch transfer layer 204. In this manner, one or more microchannels 502 can be formed over the substrate 104. The microchannels 502 can be formed to a same or a different width than the microchannels 302. For example, the microchannels 502 can be wider or narrower than the microchannels 302. In this manner, the critical dimensions of the microchannels 302 and 502 can be tuned based on the heat distribution or cooling requirements of any underlying structures (e.g., chips, core regions, non-core regions, etc.) in the semiconductor structure 100.

FIGS. 6A and 6B depict cross-sectional views of the semiconductor structure 100 taken along the lines X and Y of FIG. 1, respectively, after a processing operation according to one or more embodiments of the invention. As shown in FIGS. 6A and 6B, in some embodiments of the invention, exposed surfaces of the etch transfer layer 204 and the hard mask 202 can be recessed. The etch transfer layer 204 and the hard mask 202 can be recessed using a wet etch, a dry etch, or a combination of wet and/or dry etches. In some embodiments of the invention, the etch transfer layer 204 and the hard mask 202 are recessed using a RIE. In some embodiments of the invention, the RIE is selective to the photoresist 206.

As shown in FIGS. 6A and 6B, during this etch process the microchannels 502 can be partially recessed into the etch transfer layer 204, while the microchannels 302 can be further recessed into the etch transfer layer 204 and the manifolds 208 can be further recessed into the hard mask 202. As a result, the microchannels 302, the microchannels 502, and the manifolds 208 have an etch differential with respect to the etch transfer layer 204. These etch differentials are the result of the extra manifold etch process discussed previously herein with respect to FIG. 3B and the additional recessing of the microchannels 302 as discussed with respect to FIG. 4A.

While not depicted for ease of illustration and discussion, this process (FIGS. 5A-6B) of patterning the photoresist 206 with new microchannels and further etching the microchannels and manifolds can be repeated any number of times to form any number of microchannels having a variety of widths and depths (critical dimensions). Once the desired microchannels and manifolds have been formed, the patterns can be transferred into the substrate 104 using any suitable process, such as a wet etch, a dry etch, or a combination or wet and/or dry etches. In this manner, a patterned substrate having a wide variety of microchannels (different depths/widths) can be formed. FIGS. 10A, 10B, and 10C depict some example substrates formed according to one or more embodiments of this invention, but it is understood that a substrate having any arbitrary arrangement of microchannels having different critical dimensions can be formed in this manner.

FIGS. 7-9B depict a process for forming microchannels having varied critical dimensions that relies on creating an etch differential in a hard mask layer of a patterning stack. FIG. 7 depicts a cross-sectional view of a semiconductor structure 700 taken along the line Y of FIG. 1 after a processing operation according to one or more embodiments of the invention. In some embodiments of the invention, a patterning film stack is formed over the substrate 104, in a similar manner as discussed previously herein with respect to FIGS. 2-6B.

As illustrated in FIG. 7, in some embodiments of the invention, portions of the photoresist 206 can be patterned in a first region of the substrate 104 to expose a top surface of the etch transfer layer 204. The photoresist 206 can be patterned using a wet etch, a dry etch, or a combination of wet and/or dry etches, or any suitable photolithographic technique. In some embodiments of the invention, the photoresist 206 is patterned selective to the etch transfer layer 204. In this manner, manifold(s) 208 (i.e., an input manifold and an output manifold) can be formed over the substrate 104.

In some embodiments of the invention, the exposed surface of the etch transfer layer 204 in the manifolds 208 can be recessed to expose a surface of the hard mask 202. The etch transfer layer 204 can be recessed using a wet etch, a dry etch, or a combination of wet and/or dry etches. In some embodiments of the invention, the etch transfer layer 204 is recessed using a RIE. In some embodiments of the invention, the RIE is selective to the photoresist 206.

As further depicted in FIG. 7, in some embodiments of the invention, the exposed surface of the hard mask 202 can be recessed. The hard mask 202 can be recessed using a wet etch, a dry etch, or a combination of wet and/or dry etches. In some embodiments of the invention, the hard mask 202 is recessed using a RIE. In this manner, the manifolds 208 are already partially etched into the hard mask 202 prior to forming any microchannels.

FIGS. 8A and 8B depict cross-sectional views of the semiconductor structure 700 taken along the lines X and Y of FIG. 1, respectively, after a processing operation according to one or more embodiments of the invention. As shown in FIG. 8A, in some embodiments of the invention, portions of the photoresist 206 in a second region of the substrate 104 can be patterned to expose a surface of the etch transfer layer 204. In this manner, one or more microchannels 802 can be formed over the substrate 104. In some embodiments of the invention, the photoresist 206 is patterned selective to the etch transfer layer 204.

FIGS. 9A and 9B depict cross-sectional views of the semiconductor structure 700 taken along the lines X and Y of FIG. 1, respectively, after a processing operation according to one or more embodiments of the invention. As shown in FIGS. 9A and 9B, in some embodiments of the invention, exposed surfaces of the etch transfer layer 204 and the hard mask 202 can be recessed. The etch transfer layer 204 and the hard mask 202 can be recessed using a wet etch, a dry etch, or a combination of wet and/or dry etches. In some embodiments of the invention, the etch transfer layer 204 and the hard mask 202 are recessed using a RIE. In some embodiments of the invention, the RIE is selective to the photoresist 206.

As further shown in FIGS. 9A and 9B, during this etch process the microchannels 802 can be recessed to a surface of the hard mask 202, while the manifolds 208 can be further recessed into the hard mask 202. As a result, the microchannels 802 and manifolds 208 have an etch differential with respect to the hard mask 202. This etch differential is a result of the extra manifold etch process discussed previously herein with respect to FIGS. 8B and 9B.

While not depicted for ease of illustration and discussion, this process of patterning the photoresist 206 with new microchannels and etching the microchannels and manifolds (discussed with respect to FIGS. 5A-6B) can be repeated any number of times to form any number of microchannels having a variety of widths and depths (critical dimensions). Once the desired microchannels and manifolds have been formed, the patterns can be transferred into the substrate 104 using any suitable process, such as a wet etch, a dry etch, or a combination or wet and/or dry etches. In this manner, a patterned substrate having a wide variety of microchannels (different depths/widths) can be formed. FIGS. 10A, 10B, and 10C depict some example substrates formed according to one or more embodiments of this invention, but it is understood that a substrate having any arbitrary arrangement of microchannels having different critical dimensions can be formed in this manner.

FIGS. 10A, 10B, and 10C depict cross-sectional views of semiconductor structures 1000, 1002, and 1004, respectively, after an initial set of fabrication operations have been applied as part of a method of fabricating a final semiconductor device according to one or more embodiments of the invention. In some embodiments of the invention, the semiconductor structures 1000, 1002, and 1004 can each include microchannels 1006 having a variety of widths and depths formed in a substrate 104. The microchannels 1006 can be connected to input/output manifolds 1008 to allow for the flow a liquid or gas cooling fluid. As discussed previously herein, tuning the width and depth of each of the microchannels 1006 allows for the cooling of the substrate to be optimized. In other words, regions of relatively higher power densities or heat generation (such as regions over an integrated circuit core) can be provided relatively narrower, deeper microchannels for improved cooling fluid contact and heat removal, while low temperature regions can be provided relatively wider, shallower microchannels to minimize the total pressure drop across the cooler interface and to direct more of the cooling fluid to the most critical (highest heat generation) regions.

Figure 11:
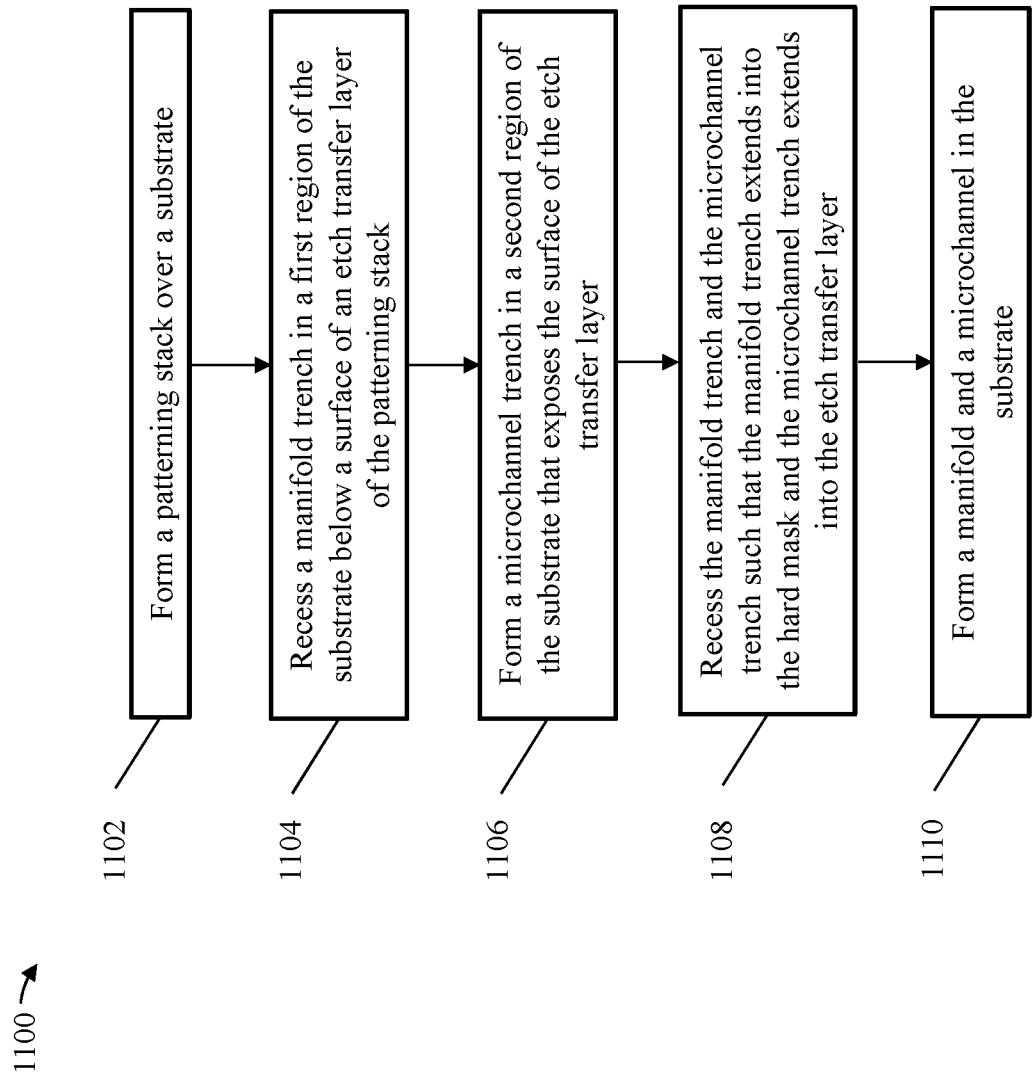
FIG. 11 depicts a flow diagram illustrating a method according to one or more embodiments of the invention.

FIG. 11 depicts a flow diagram 1100 illustrating a method for forming a semiconductor device according to one or more embodiments of the invention. As shown at block 1102, a patterning stack is formed over a substrate. The patterning stack includes a hard mask, an etch transfer layer on the hard mask, and a photoresist on the etch transfer layer. In some embodiments of the invention, the hard mask includes a nitride and the etch transfer layer includes an oxide. In some embodiments of the invention, the oxide is selected to ensure that the etch transfer layer etches at a faster rate than the hard mask when recessing the manifold trench and the microchannel trench.

At block 1104, a manifold trench is formed in a first region of the substrate. The manifold trench is recessed below a surface of the etch transfer layer. At block 1106, a microchannel trench is formed in a second region of the substrate. The microchannel trench exposes the surface of the etch transfer layer.

At block 1108, the manifold trench and the microchannel trench are recessed such that the manifold trench extends into the hard mask and the microchannel trench extends into the etch transfer layer. In some embodiments of the invention, the manifold trench and the microchannel trench are recessed concurrently during a same etch process. At block 1110, a manifold and a microchannel are formed in the substrate. In some embodiments of the invention, forming the manifold and the microchannel includes a pattern transfer of the manifold trench and the microchannel trench into the substrate.

The method can further include, after recessing the microchannel trench into the etch transfer layer, forming a second microchannel trench in a third region of the substrate. The manifold trench, the microchannel trench, and the second microchannel trench can be recessed such that the microchannel trench extends into the etch transfer layer to a first depth and the second microchannel extends into the etch transfer layer to a second depth less than the first depth. In some embodiments of the invention, a width of the microchannel trench is greater than a width of the second microchannel trench. In some embodiments of the invention, a width of the microchannel trench is less than a width of the second microchannel trench.

Figure 12:
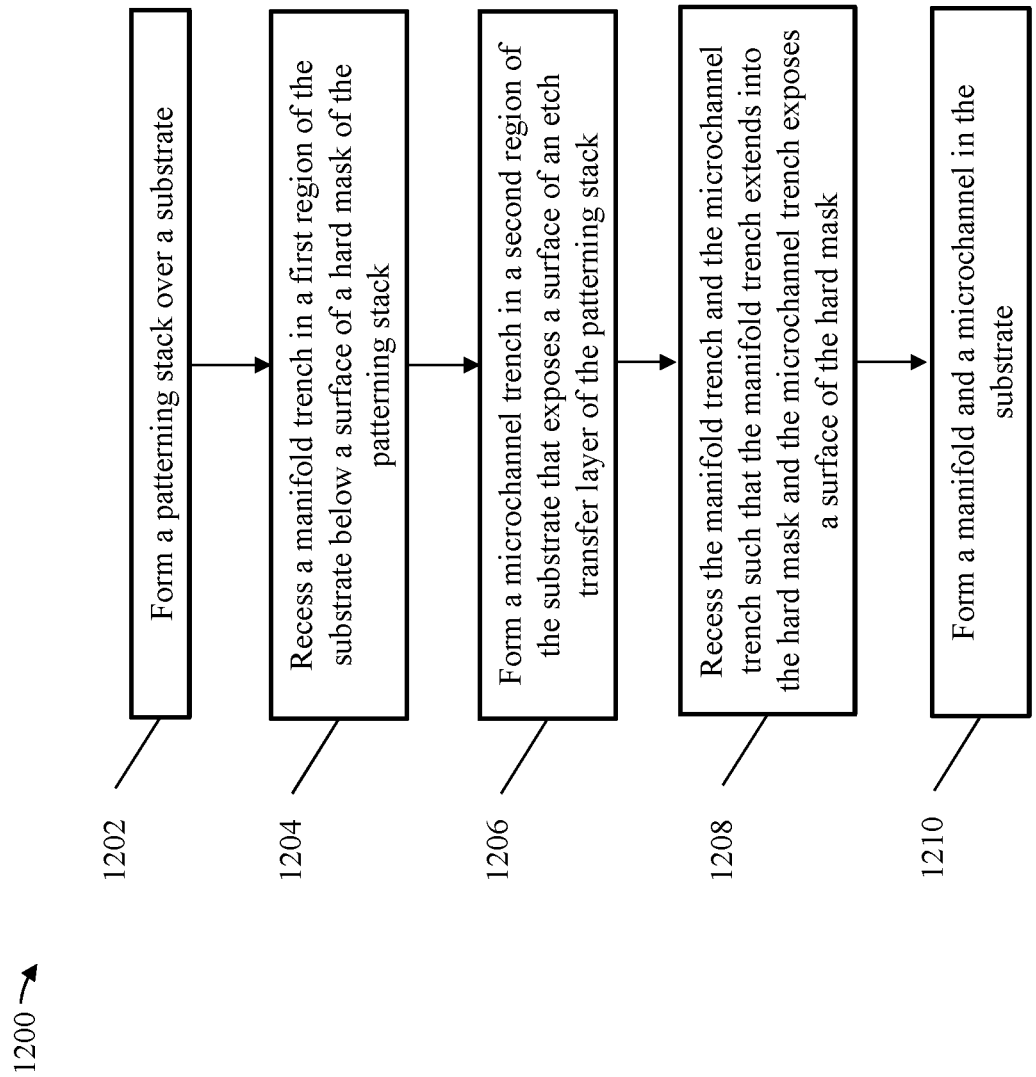
FIG. 12 depicts a flow diagram illustrating a method according to one or more embodiments of the invention.

FIG. 12 depicts a flow diagram 1200 illustrating a method for forming a semiconductor device according to one or more embodiments of the invention. As shown at block 1102, a patterning stack is formed over a substrate. The patterning stack includes a hard mask, an etch transfer layer on the hard mask, and a photoresist on the etch transfer layer. In some embodiments of the invention, the hard mask includes a nitride and the etch transfer layer includes an oxide. In some embodiments of the invention, the oxide is selected to ensure that the etch transfer layer etches at a faster rate than the hard mask when recessing the manifold trench and the microchannel trench. In some embodiments of the invention, the hard mask includes a nitride and the etch transfer layer includes an oxide. In some embodiments of the invention, the oxide is selected to ensure that the etch transfer layer etches at a faster rate than the hard mask when recessing the manifold trench and the microchannel trench.

At block 1204, a manifold trench is formed in a first region of the substrate. The manifold trench is recessed below a surface of the hard mask. At block 1206, a microchannel trench is formed in a second region of the substrate. The microchannel trench exposes a surface of the etch transfer layer.

At block 1208, the manifold trench and the microchannel trench are recessed such that the manifold trench extends into the hard mask and the microchannel trench exposes a surface of the hard mask. In some embodiments of the invention, the manifold trench and the microchannel trench are recessed concurrently during a same etch process. At block 1210, a manifold and a microchannel (a first microchannel) are formed in the substrate.

The method can further include, after recessing the microchannel trench to expose a surface of the hard mask, forming a second microchannel trench in a third region of the substrate. The second microchannel trench exposes a surface of the etch transfer layer. In some embodiments of the invention, a critical dimension (width, height, or both) of the second microchannel is different than the first microchannel. For example, a width of the microchannel trench can be greater than or less than a width of the second microchannel trench. In this manner, the critical dimensions (width and height) of the first and second microchannel trenches can be separately tailored to the cooling requirements of the various regions of the substrate. For example, high power density (high heat generation) regions of the substrate can be provided with narrow, deep channels for increased cooling fluid flow. Moreover, while described with respect to first microchannels and second microchannels, any number of microchannels having different critical dimensions can be formed in the substrate. In some embodiments of the invention, the microchannels provide a gradient of critical dimensions between high power density and low power density regions (see, for example, FIG. 10B, although other configurations are within the contemplated scope of the invention).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a patterning stack over a substrate, the patterning stack comprising a hard mask, an etch transfer layer on the hard mask, and a photoresist on the etch transfer layer;

forming a manifold trench in a first region of the substrate, the manifold trench recessed below a topmost surface of the etch transfer layer;

forming a microchannel trench in a second region of the substrate by removing a portion of the photoresist layer to expose the topmost surface of the etch transfer layer;

recessing the manifold trench and the microchannel trench such that the manifold trench punches through the etch transfer layer and recesses a topmost surface of the hard mask and the microchannel trench recesses the topmost surface of the etch transfer layer; and forming a manifold and a microchannel in the substrate.

2. The method of claim 1, wherein forming the manifold and the microchannel comprises a pattern transfer of the manifold trench and the microchannel trench into the substrate.

3. The method of claim 1, wherein the manifold trench and the microchannel trench are recessed concurrently during a same etch process.

4. The method of claim 1 further comprising, after recessing the microchannel trench into the etch transfer layer, forming a second microchannel trench in a third region of the substrate.

5. The method of claim 4 further comprising recessing the manifold trench, the microchannel trench, and the second microchannel trench such that the microchannel trench extends into the etch transfer layer to a first depth and the second microchannel extends into the etch transfer layer to a second depth less than the first depth.

6. The method of claim 5, wherein a width of the microchannel trench is greater than a width of the second microchannel trench.

7. The method of claim 5, wherein a width of the microchannel trench is less than a width of the second microchannel trench.

8. The method of claim 1, wherein the hard mask comprises a nitride and the etch transfer layer comprises an oxide.

9. The method of claim 8, wherein the oxide is selected to ensure that the etch transfer layer etches at a faster rate than the hard mask when recessing the manifold trench and the microchannel trench.

10. A method for forming a semiconductor device, the method comprising:

forming a patterning stack over a substrate, the patterning stack comprising a hard mask, an etch transfer layer on the hard mask, and a photoresist on the etch transfer layer;

forming a manifold trench in a first region of the substrate, the manifold trench recessed below a topmost surface of the hard mask;

forming a microchannel trench in a second region of the substrate by removing a portion of the photoresist layer to expose a topmost surface of the etch transfer layer;

recessing the manifold trench and the microchannel trench such that the manifold trench extends further into the hard mask and the microchannel trench punches through the etch transfer layer and exposes the topmost surface of the hard mask; and forming a manifold and a microchannel in the substrate.

11. The method of claim 10, wherein forming the manifold and the microchannel comprises a pattern transfer of the manifold trench and the microchannel trench into the substrate.

12. The method of claim 10, wherein the manifold trench and the microchannel trench are recessed concurrently during a same etch process.

13. The method of claim 10 further comprising, after recessing the microchannel trench to expose a surface of the hard mask, forming a second microchannel trench in a third region of the substrate, the second microchannel trench exposing a surface of the etch transfer layer.

14. The method of claim 13, wherein a width of the microchannel trench is greater than a width of the second microchannel trench.

15. The method of claim 13, wherein a width of the microchannel trench is less than a width of the second microchannel trench.

16. The method of claim 10, wherein the hard mask comprises a nitride and the etch transfer layer comprises an oxide.

17. The method of claim 16, wherein the oxide is selected to ensure that the etch transfer layer etches at a faster rate than the hard mask when recessing the manifold trench and the microchannel trench.

\* \* \* \* \*